United States Patent [19]

Engeler et al.

[11] 4,185,318
[45] Jan. 22, 1980

[54] CHARGE STORAGE MEMORY WITH ISOLATION NODAL FOR EACH BIT LINE

[75] Inventors: William E. Engeler, Scotia; Jerome J. Tiemann, Schenectady; Richard D. Baertsch, Scotia, all of N.Y.

[73] Assignee: General Electric Company, Schenectady, N.Y.

[21] Appl. No.: 915,784

[22] Filed: Jun. 15, 1978

Related U.S. Application Data

[63] Continuation of Ser. No. 137,238, Apr. 26, 1971, abandoned.

[51] Int. Cl.² .................. G11C 11/34; G11C 7/00
[52] U.S. Cl. ............................ 365/183; 365/189
[58] Field of Search ............ 365/183, 202, 205, 189

[56] References Cited
U.S. PATENT DOCUMENTS 3,720,922  3/1973  Kosonocky ................ 365/183

*Primary Examiner*—Stuart N. Hecker
*Attorney, Agent, or Firm*—Julius J. Zaskalicky; Joseph T. Cohen; Marvin Snyder

[57] ABSTRACT

A conductor-insulator-semiconductor (CIS) structure for a random access surface charge memory system is disclosed. The memory system comprises an array of memory cells including charge storage regions, charge transfer regions and charge receive-source regions formed along the surface-adjacent portions of a semiconductor substrate. A charge-storage line insulatingly overlies the storage regions of a row of memory cells and a bit line, comprising an extended region of opposite-conductivity-type, interconnects the receive-source regions of the same memory cells. Addressing in the Y-direction (word selection) is provided by charge transfer lines insulatingly overlying the charge transfer regions of a column of memory cells. Selected memory cells are addressed for read and write purposes by first activating the word select line which makes available one cell in each row of the memory. The desired row is then selected by means external to the array of memory cells. All cells of the selected word line are refreshed, but only one cell is addressed for read and write purposes. Means for reading, writing and refreshing data in the memory system are also disclosed.

7 Claims, 5 Drawing Figures

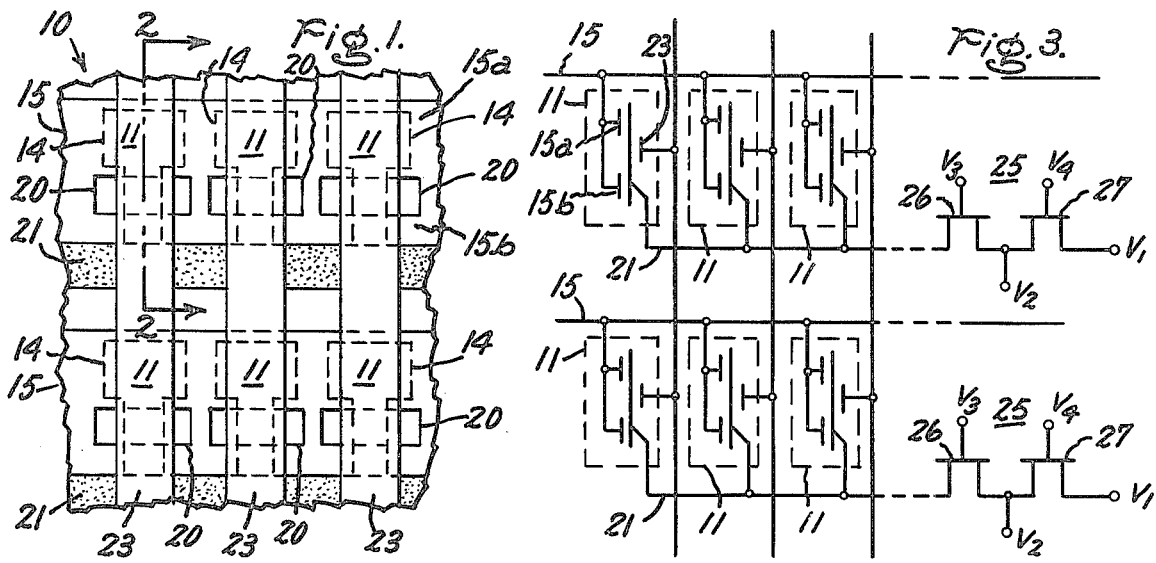
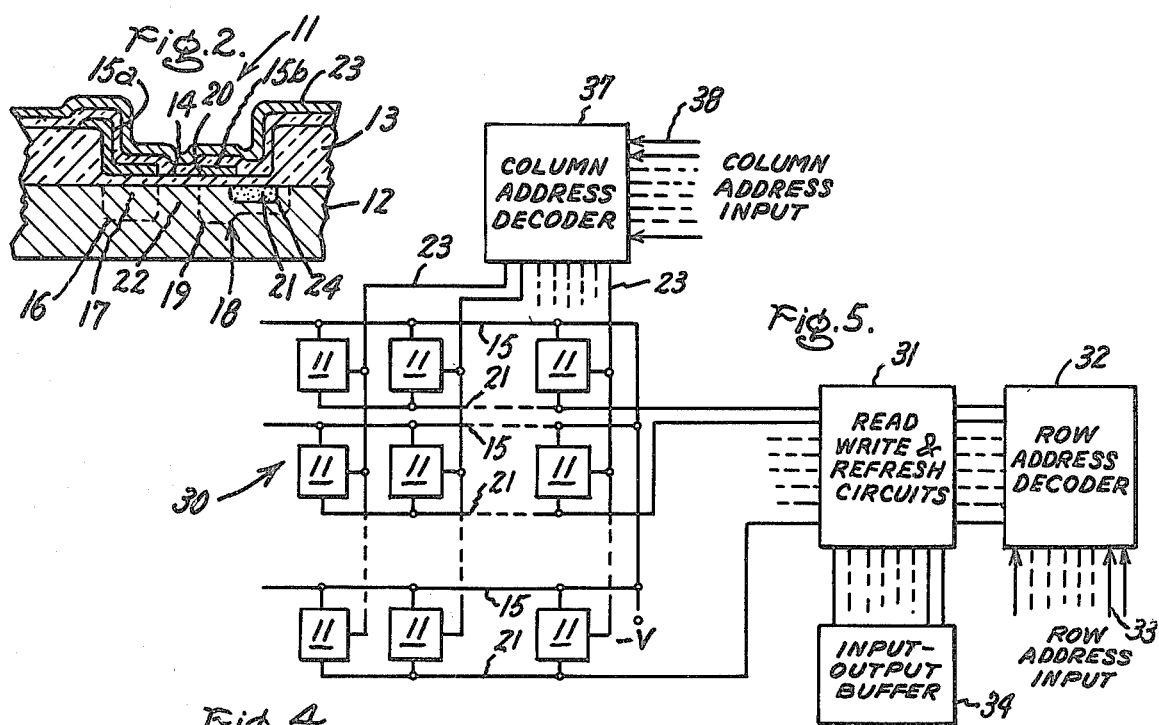
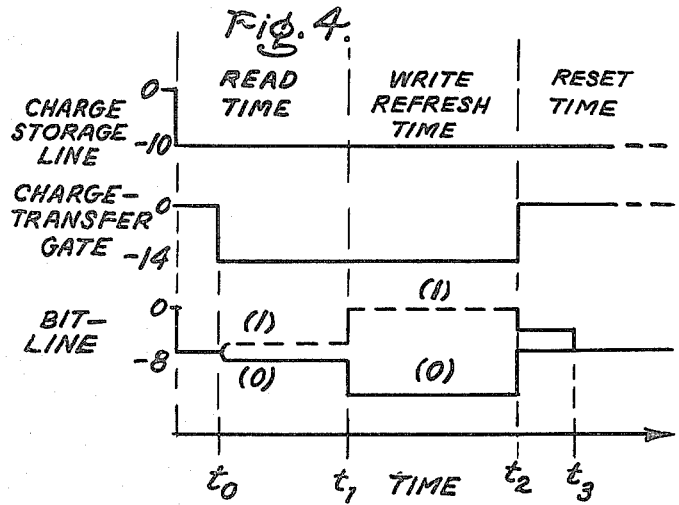

CHARGE STORAGE MEMORY WITH ISOLATION NODAL FOR EACH BIT LINE

This is a continuation of application Ser. No. 137,238, filed Apr. 26, 1971, now abandoned.

The present invention relates to methods and apparatus for storing and handling information and more particularly conductor-insulator-semiconductor (CIS) structures wherein the information is stored and transferred in the form of electrical charges along the semiconductorinsulator interface. This application is related to copending applications Ser. Nos. 792,488 now U.S. Pat. No. 3,623,026 and 792,569 now abandoned filed Jan. 21, 1969, and Ser. No. 69,649 now U.S. Pat. No. 770,988 filed Sept. 4, 1970, and Ser. No. 84,659 now abandoned filed Oct. 28, 1970, all of common assignee as the instant application and the disclosures of which are incorporated herein by reference thereto.

The importance of information storage devices, both long term and transitory, is well known to those skilled in computer and related arts. Some typical storage apparatus employed for this purpose include magnetic core memories, thin film magnetic memories, bipolar transistor storage memories and more recently field-effect transistor memories. Continued requirements for smaller, highly reliable and faster access time memories have motivated researchers to develop a conductor-insulator-semiconductor structure as a basic storage element. Briefly, the CIS structure provides storage of electrical charges by the formation of depletion regions in the semiconductor underlying a conductor member. The electrical charges to be stored are generated either within the semiconductor itself in response to electromagnetic radiation, for example, or through injecting electrodes. The above-identified applications disclose various arrangements of CIS structures which advantageously provide high density, high speed storage and transfer of the stored information.

Memory systems requiring fast access times are generally arranged in an X-Y matrix of rows and columns of memory cells. Information is read into and out of a selected memory cell by row and column addressing. Dynamic memory cells employing metal-oxide-semiconductor circuits, such as those described by M. E. Hoff, Jr., in *Electronics* of Aug. 3, 1970, additionally require periodic refreshing or rewriting of the stored data. Each memory cell of that array requires three field-effect transistors to provide the storage function. The fabrication of such memory cells in large arrays is difficult and results in costly memory arrays. Further, the number of components necessary to provide the memory function limits the ultimate storage density of the array.

It is therefore an object of this invention to provide an improved memory cell.

It is a further object of this invention to provide a method and apparatus for storing information in the form of an electrical charge in the surface of a semiconductor substrate.

It is a further object of this invention to provide a dynamic memory with high storage density and fast access times.

Still another object of this invention is to provide methods and apparatus for reading, writing and refreshing information in a dynamic memory cell.

Briefly, in accord with one embodiment of our invention, an array of dynamic memory cells are arranged in an X-Y matrix of rows and columns along the surface-adjacent portions of a semiconductor substrate. Each memory cell comprises a conductor-insulator-semiconductor (CIS) structure including a charge storage region, a charge transfer region and a charge receive-source region. The charge storage regions are formed in the surface-adjacent portions of the semiconductor substrate under a charge-storage line which overlies the storage regions of a row of memory cells. The charge receive-source regions are separated from the storage regions by the charge transfer regions and include an extended region of opposite-conductivity-type from the semiconductor substrate. The opposite-conductivity-type regions interconnect the receive-source regions of a row of memory cells.

Information in the form of digital binary bits, for example, are stored in the array of memory cells and are word-addressed in a Y-direction by charge transfer lines overlying the charge transfer regions of a column of memory cells. To refresh data or to write new data, the stored data is first recovered by addressing an entire column of charge transfer regions. The stored charge is then transferred from the selected storage regions to the associated bit lines where it is detected and converted to binary data. The binary data together with any new data is used to restore the potentials on the storage region. Bit addressing in the X-direction is achieved by gating the desired output data onto an output line and by gating the input data to the desired refresh circuit. Conventional logic circuits are used to perform this function.

The novel features believed characteristic of the present invention are set forth in the appended claims. The invention itself, together with further objects and advantages thereof, may be understood with reference to the following detailed description taken in connection with the accompanying drawings in which:

FIG. 1 is a partial plan view of an array of memory cells and row and column address lines;

FIG. 2 is a partial cross-sectional view taken along the lines 2—2 of FIG. 1;

FIG. 3 is a schematic illustration of the array of memory elements and address lines illustrated in FIG. 1;

FIG. 4 illustrates typical voltage waveforms of the address lines during read, write and refresh times; and FIG. 5 is a partial schematic illustration of a dynamic random access memory in accord with another embodiment of our invention.

FIG. 1 illustrates, by way of example, a plan view of a dynamic memory 10 including a plurality of memory cells 11 arranged in an X-Y matrix of rows and columns. FIG. 1 illustrates only two rows and three columns of a larger memory array which may, for example, include 64 rows and 16 columns to provide a 1024-bit memory. The novel dynamic memory 10 provides information storage in the form of electrical charge stored at the surface-adjacent portions of a semiconductor substrate. Briefly, this type storage is provided by a conductor-insulator-semiconductor (CIS) structure in which a depletion region forming voltage is applied to a conductor insulatingly overlying the semiconductor substrate to form a depletion region therein so that minority carriers can be stored at the semiconductor surface, adjacent the semiconductor-insulator interface. Storage times are primarily determined by the rate of arrival of minority carriers due to thermal generation at interface states. Hence, the semiconductor material is selected to have a time constant for the generation of minority carriers which is long compared to the desired information storage interval. Reference may be made to the above-identified applications Ser. Nos. 792,488 and 792,569 filed Jan. 21, 1969, for a more detailed description of CIS charge storage, if desired.

FIG. 2, a cross-sectional view taken along the lines 2—2 of FIG. 1, illustrates a typical memory cell 11 as comprising a semiconductor substrate 12 of one-conductivity type, such as n-type silicon, for example. One major surface of the semiconductor substrate 12 if provided with an insulator layer 13 which may, for example, comprise any of the numerous useful semiconductor-insulator materials, such as silicon dioxide, silicon nitride, aluminum oxide or silicon oxynitride, for example, used separately or in combination. The insulator layer 13 includes a cellule 14 formed in the insulator layer as a region of thinner insulator material than the regions surrounding the cellule. The formation of a cellule may, for example, be provided by selective masking and etching of the insulator layer by techniques well known to those skilled in the art.

A charge storage line 15 comprising a first portion 15a and a second portion 15b is formed of a conductive or semiconductive material, for example, and overlies at least a portion of each cellule in the same row. FIG. 1, for example, illustrates a first charge storage line 15 overlying three cellules of row 1 and a second charge storage line 15 overlying three cellules of row 2. The charge storage line 15 also includes openings 20 which are in alignment with a portion of the cellules 14. The application of a depletion-region forming voltage to the chargestorage line 15 relative to the substrate 12 causes the formation of depletion regions 16 and 19 in the surface-adjacent portion of the semiconductor substrate underlying conductor portions 15a and 15b, respectively. The depletion regions 16 and 19 are separated from each other by a non-depleted or barrier region 22 which results from the opening 20 in the charge storage line 15. The depletion regions 16 and 19 are confined to the area of the cellule underlying the charge-storage line 15 but only in the cellular region 14 where the insulator layer thickness is sufficently thin to permit the applied voltage to form depletion regions 16 and 19. More specifically and by way of example, an insulator layer thickness of 1,000 Angstroms in the cellular region 14 and a thickness of approximately 9,000 Å outside the cellular region enables a 10-volt potential applied to the charge-storage line 15 to produce the depletion regions 16 and 19 illustrated in the thinner regions of the insulator but not in the thicker regions. Those skilled in the art can appreciate that the effective depth of the depletion regions can be altered by varying the magnitude of the depletion region forming voltage and/or the thickness of the insulator layer.

In accord with our invention, the depletion region 16 is used to store electrical charges in the form of minority carriers (i.e., holes for n-type semiconductor material) near the surface-adjacent portion of the semiconductor substrate 12 adjacent the semiconductor-insulator interface. This region, referred to as a charge storage region, is illustrated in FIG. 2 by the numeral 17. Electrical charges are introduced and removed from the charge storage region 17 by a charge receive-source region 18 including the depletion region 19 and an opposite-conductivity-type region 21, formed in the surface of the substrate 12 adjacent the charge storage line 15 and parallel thereto.

The opposite-conductivity region 21 forms a P-N junction 24 with the semiconductor substrate 12. The application of a selectively variable negative bias voltage to the opposite-conductivity region 21 relative to the n-type semiconductor substrate 12 permits selectively variable amounts of electrical charge to be introduced into the storage region 17 or, conversely, to receive charge from the storage region 17. However, in addition to controlling the bias voltage on the P-N junction 24, it is also necessary to lower the surface potential of the barrier region 22 between the receive-source region 18 and the storage region 17. The surface potential of the intermediate barrier region 22 is controlled by a voltage applied to a charge transfer line 23 comprising a conductive member insulatingly overlying the openings 20 in the charge storage lines 15 and substantially orthogonal thereto. Advantageously, the charge transfer line 23 overlies similar barrier regions 22 for all cellules in the same column. For a more detailed description of the operation of a P-N junction to introduce or remove charge from a semiconductor substrate, reference may be made to our copending application Ser. No. 69,649 filed Sept. 4, 1970.

FIG. 1 illustrates an embodiment of our invention in which the opposite-conductivity region 21 is a continuous p-type diffused region, for example, interconnecting the charge receive-source regions 18 in a single row. In accord with another embodiment of our invention, the conductivity of this p-type diffused region may be enhanced and the speed of charge transfer improved by the formation of a separate conductor (not shown) overlying the p-type diffused region and in electrical contact therewith. It is to be understood, however, that a continuous contact is not necessary and that periodic contact points may also be employed, if desired, without departing from the spirit and scope of our present invention.

Other modifications of the basic storage structure are also contemplated. For example, the charge storage line 15 which controls both the charge storage region 17 and the receive-source storage region 18 can be modified so that it includes the portion 15a overlying the depletion region 16. In this configuration, the opposite-conductivity-type region 21 can be extended to the barrier region 22 without loss of function. Still other modifications are possible without departing from the spirit and scope of our present invention.

The embodiment of our invention illustrated in FIG. 1 is schematically illustrated in FIG. 3. Each memory cell 11 is illustrated as comprising a storage electrode 15a electrically connected to a receive-source electrode 15b and a transfer electrode 23. The memory cells 11 are schematically arranged in rows and columns similar to those illustrated in FIG. 1. FIG. 3 also illustrates the opposite-conductivity-type region 21 of each row as terminating in a circuit 25 for sensing (or reading) the stored charge and for setting the potential on the opposite-conductivity-type region 21, hereinafter referred to as a "bit-line," when charge is introduced (or written) into the storage regions 17.

The operation of the dynamic memory 10 can be understood by considering the sequence of events which occur in the read and write or refresh cycles of the memory. For example, assume that binary information is to be stored in the memory and that a binary zero is represented by substantially no charge in a storage region or at least a charge below a predetermined level and that a binary one is represented by substantially the maximum charge capable of being stored in the storage region or at least a charge above a predetermined level. To store or write information into a selected memory cell, it is only necessary to apply the appropriate voltages to the desired row-associated bit-line 21, charge storage line 15 and the desired charge transfer line 23.

For example, for cellules having an insulator layer thickness of approximately 1,000 Å, to write a binary zero, the bit-line 21 is activated with a potential of approximately minus 14 volts. To write a binary one, the bit-line is activated with a potential of approximately minus one volt. The charge storage line is activated by a potential of approximately minus 10 volts. The selected charge transfer line 23 is also activated by the application of a potential of approximately minus 14 volts. The application of these potentials to a selected row and column store or write a binary zero or one (depending on the bit-select line potential) in the charge storage region 17. The removal of the potential from the charge transfer line 23 and its return to substrate potential (or a more positive potential) re-establishes the potential barrier 22 between the storage region 17 and the receive-source region 18, thereby storing the binary zero or one in the storage region 17. The activation of several bit-lines, either at minus one or at minus 14 volts permits information storage in several rows and the selected column simultaneously.

Those skilled in the art can readily appreciate that eventually the rate of arrival of minority carriers due to thermal generation at the surface of the semiconductor substrate causes loss of the stored information. Hence, the memory array exhibits a finite storage time. By proper choice of the semiconductor substrate 12, the rate of arrival of minority carriers can be minimized so that storage time intervals in the order of hundreds of milliseconds and longer may be achieved before equilibrium is reached. Before this condition is reached, it is desirable to read out the stored information and refresh or rewrite the information back into the memory cell. Alternately, new data may be stored in the memory cells at this time, if desired. In any event, unless the stored information is utilized in some way before equilibrium conditions are reestablished, the information is lost.

In accord with a novel aspect of our present invention, read, write and refresh functions are performed periodically on a column-by-column basis. For example, if each column represents a digital word comprising a number of bits, equal to the number of rows of memory cells, the entire memory array can be refreshed by sequentially addressing each word. For the embodiment of our invention illustrated in FIGS. 1 and 3 each word is addressed by the activation of a selected charge transfer line 23. A refresh circuit 25 associated with each row senses or reads the signal contained in the addressed word line and reestablishes (or refreshes) this signal by setting the bit-line at the necessary potential.

A portion of a particularly useful refresh circuit 25 is illustrated in FIG. 3 as comprising field-effect transistors 26 and 27 serially connected to a voltage source $V_1$. A voltage $V_2$ is established at the nodal point between transistors 26 and 27 of approximately minus 8 volts, for example, by applying a potential $V_3$ on the gate electrode of transistor 26 approximately equal to that of the charge storage line 15, while maintaining the potential $V_4$ on the gate electrode of transistor 27 at a relatively large value, e.g., minus 25 volts. Then, charge will drain from the bit-line (previously biased to minus 5 volts) until the threshold of transistor 26 is reached. Then, transistor 27 is turned off by returning the gate electrode of transistor 27 to the substrate potential. This effectively isolates the nodal point between the two transistors, setting $V_2$ at a low negative potential. When charge is introduced onto the bit-line 21 from a storage location, it biases transistor 26 above its threshold and charge flows through it and collects at the nodal point, causing a relatively large change in the value of the voltage $V_2$. This voltage may, for example, be used to operate the gate of another transistor, such as a source follower, to provide an output signal from the memory array.

FIG. 4 illustrates typical voltage-versus-time waveforms associated with reading, writing and refreshing data stored in a dynamic memory, similar to that described above with reference to FIGS. 1–3. Read time, for example, occurs during a time interval $t_0$ to $t_1$ with the activation of a particular charge transfer line. For the insulator thicknesses described above, a charge storage line is activated with approximately minus 10 volts, the charge transfer line with approximately minus 14 volts and the bit-line with approximately minus 8 volts, a potential intermediate that which is used to write a binary one or binary zero. Then, if a binary zero is stored in the storage region, the surface potential of the storage region is below minus 8 volts and hence no charge flows to the bit-line. This condition is sensed by suitable circuit means, such as the one described above and a readout signal (indicative of a stored binary zero) is then provided to a buffer or display, for example.

If a binary one is stored in the storage region, the surface potential of the storage region is above minus 8 volts hence charge transfers to the bit-selected line. The circuit 25, for example, senses this charge and provides a readout signal indicative of a stored binary one. By activating several or all rows of the memory simultaneously, readout for a whole column of storage regions is obtained. This output may then be utilized to refresh the memory as described above.

Between times $t_1$ and $t_2$, new information may be written into the memory cells or the information previously read out can be refreshed, i.e., re-established in charge amplitude and returned to the memory cell. The new or refreshed information is written into the entire column selected by the column addressing techniques, described above, for example. The charge storage and charge transfer lines are maintained at approximately the same level as for reading and the bit-line voltage of each row is varied in accord with the desired information to be stored at the bit position associated with that row. For example, to write a binary zero at one bit location, the bit-line voltage of that row is set at approximately minus 15 volts. Since the surface potential of the depletion region formed thereby is below that of the charge storage region, no charge is transferred to the storage region. Hence, when the charge transfer line voltage is removed, a binary zero is stored. To write a binary one, the bit-line voltage is set at approximately minus one volt. This causes charge to flow to the storage region and be stored there, upon removal of the voltage from the charge transfer line.

After the necessary write-refresh time, the charge transfer lines are set to zero volts and the bit-lines are brought to approximately minus 5 volts for a reset time interval $t_2$ to $t_3$ and then returned to approximately minus 8 volts. During the reset time, the charge associated with writing a binary one leaks off and hence is not confused with the stored charge to be read on the next cycle.

A dynamic memory system, particularly useful for high density information storage is illustrated in FIG. 5. The memory system 30 comprises a plurality of memory cells 11, similar to those described above, for example, arranged in 32 rows and 16 columns. FIG. 5 illustrates only a small portion of the total number of rows and columns, but additional rows and columns may be connected in a manner illustrated in the drawing, if desired. The charge-storage lines 15 of each row of memory cells are connected together and may, for example, be connected directly to a source of negative voltage, $-V$, which establishes the charge storage capacity in the storage regions 17. The bit-lines 21 are connected to read, write and refresh circuits 31 which may, for example, include integrated circuit elements formed in the semiconductor substrate 12 to sense the magnitude of the stored charge, for reading information from the memory cells and also for writing and refreshing the stored charges. The read, write and refresh circuits 31 are connected to a row address decoder 32 having input lines 33 for addressing the desired row or rows of memory cells. The read, write and refresh circuits 31 are also connected to an input-output buffer 34 having input lines 35 and at least one output line 36 for reading out information stored in the memory system. The memory system 30 also includes a column address decoder 37 connected to the charge-transfer lines 23 of each column of memory cells. The column address decoder 37 has input lines 38 for addressing the desired charge transfer line.

The memory system 25 is operated in substantially the same manner described above with reference to FIGS. 1 through 3. In particular, to write data into a selected memory word, a row address line 33 and a column address line 38 are activated. The selected memory cell is now ready to receive data from the input-output buffer 34 and store a charge, representative of an input binary one or binary zero. During the same time interval refresh circuits of non-selected rows may rewrite or refresh the data that was previously stored. Those skilled in the art can readily appreciate that several rows of memory cells can be addressed simultaneously by activating several address lines and a single charge transfer line.

Information may be read out of selected memory cells by appropriate addressing of selected column address lines 23. This information is selected by row addressing and is applied to the input-output buffer 34 and may, for example, be read out on output line 36. The sequence of steps necessary for this mode of operation are substantially similar to those described above.

Memory systems constructed in accord with our invention offer numerous advantages over prior art memory systems employing field-effect transistors, for example. In particular, memory systems constructed in accord with our invention employ only three access lines per memory cell as opposed to four lines for most memories. Further, the memory cells constructed in accord with our invention require substantially less area per cell than do memory cells employing field-effect transistors. In further accord with our invention, the capacitance per unit area of each storage cell is substantially greater than the capacitance per unit area of the bit-line and hence, during readout, the time constant associated with the bit-line does not limit the readout time. Further, substantially all charge stored in the memory cells is delivered to the low capacitance nodal point of the sensing circuit 25. This produces a large output voltage excursion even though bit-line 21 is maintained at a substantially constant voltage during the read cycle of the memory system.

Other advantages of memory systems constructed in accord with our invention will become more apparent to those skilled in the art by considering the following method for making these memory systems. By way of example, the array of memory cells 11, illustrated in FIG. 1, may be fabricated by first forming a thick thermally grown oxide 13, for example, such as silicon dioxide, over a semiconductor substrate 12, such as n-type silicon. Alternately, other useful semiconductor materials including Group III–V semiconductor compounds such as gallium arsenide, gallium phosphide or indium arsenide may also be employed, if desired. The thickness of the thermally grown oxide 13 may, for example, be 10,000 Å or more. Apertures are then formed in the thermally grown oxide 13 to the semiconductor surface 12. Each aperture may, for example, expose a 0.5 mil$^2$ area of the substrate 12. Next, a thin insulator layer, such as silicon dioxide, having a thickness of 1,000 Å, for example, is regrown in the apertures. Then the substrate is covered with a conductive or semiconductive material. Suitable materials include refractory metals, such as molybdenum, tungsten, chromium or semiconductive materials such as polycrystalline silicon. The conductive material is then patterned to produce the apertured conductor members 15. Alternately, as described above, the apertures 20 and the second portion 15b of the conductor may be eliminated and the opposite conductivity type region 21 extended to the barrier region 22. The substrate is then covered with a layer of a semiconductor impurity-containing glass, such as borosilicate glass, in which the impurity is boron. Borosilicate glasses are readily formed by the oxidation of silane and diborane, for example. The semiconductor impurity-containing glass is then removed, by etching, for example, in regions overlying the apertures 20, or where no apertures are employed, from the barrier region. The entire surface of the wafer is then covered with another insulating layer, such as pyrolytically deposited silicon dioxide and the wafer is heated to a temperature sufficient to cause diffusion of boron (e.g., 1000° to 1300° C.) into the semiconductor substrate to produce the region of opposite-conductivity 21. The semiconductor impurity-containing glass is then removed by etching, for example.

The entire surface of the substrate is then covered with another insulating layer, such as deposited silicon dioxide, and another layer of metallization, such as molybdenum, aluminum, or other conductive or semiconductive materials. This layer of metallization is patterned by photolithographic masking and etching techniques, for example, to produce the pattern of conductor members 23, illustrated in FIGS. 1 and 2. Those skilled in the art can readily appreciate that in addition to the fabrication of memory cells, column and row address decoders, read, write and refresh circuits can also be formed as an integral part of the memory system and further reduce the cost of memory systems while increasing the performance and reliability thereof.

In summary, we have provided an improved memory system employing an array of dynamic memory cells wherein information is stored in the form of an electrical charge near the surface-adjacent portions of a semiconductor substrate. Each memory cell comprises a CIS structure including charge storage regions, charge transfer regions and charge receive-source regions. Means are disclosed for addressing each memory cell for reading, writing and refreshing data in the memory cells.

While our invention is described with respect to certain specific embodiments, many modifications and variations will occur to those skilled in the art. Accordingly, by the appended claims we intend to cover all such modifications and changes as fall within the true spirit and scope of our present invention.

What we claim as new and desire to secure by Letters Patent of the United States is:

1. Apparatus for storing and retrieving information in the form of electrical charge comprising
    a semiconductor substrate of one conductivity type,
    an insulator layer overlying said substrate and having a plurality of cellular regions, each of substantially lesser thickness than the surrounding regions thereof,
    a first conductor member overlying at least a portion of each of said cellular regions,
    means for biasing said first conductor member in relation to said substrate to form a plurality of charge storage regions in a surface adjacent portion of said substrate, each storage region underlying said first conductor member and a respective cellular region,
    an opposite conductivity type region in said substrate spaced from said storage regions forming a receive-source region,
    a plurality of barrier regions in said substrate each between a respective storage region and said receive-source region,
    means for controlling the surface potentials of said barrier regions including a plurality of second conductor members each insulatingly overlying a respective barrier region,
    collecting means connected to said receive-source region for collecting charge, said collecting means including a first field effect transistor and a second field effect transistor having their current conduction paths connected in series in the order named between said receive-source region and a bias voltage source, the source and drain of said first and second transistors connected in common providing a nodal capacitance,
    means for biasing said transistors to provide a potential on said nodal capacitance which is energetically favorable for charge to transfer from said receive-source region to said nodal capacitance.

2. The apparatus of claim 1 in which said means for biasing said transistors comprises
    means for applying a first gate biasing voltage of fixed value to the gate of said first transistor and a second gate biasing voltage to the gate of said second transistor to establish a reference potential on said receive-source region at which said first field effect transistor is biased at threshold and to charge said nodal capacitance to a potential which is energetically favorable for the transfer of charge from said receive-source region to said nodal capacitance,
    means for isolating said nodal capacitance from said bias voltage source by biasing said second transistor below threshold,
    means for transferring charge representing an information bearing signal through an associated barrier region from one of said storage regions to said receive-source region including lowering the potential of said associated barrier region, said first gate biasing voltage on the gate of said first transistor being maintained at said fixed value to effect the transfer of charge representing said information bearing signal from said receive-source region into said nodal capacitance.

3. The apparatus of claim 2 including means responsive to the change in voltage on said nodal capacitance due to charge flow thereinto to provide an output signal corresponding to the information content of said one storage region.

4. The apparatus of claim 2 in which said nodal capacitance is small in relation to the capacitance of said region of opposite conductivity type.

5. Charge storage and transfer apparatus for the storage and transfer of charge corresponding to a signal comprising
    a substrate of one conductivity type,
    a first storage region in a surface adjacent portion of said substrate,
    a region of opposite conductivity type in said surface adjacent portion spaced from said storage region by a first charge transfer region,
    a second storage region in said surface adjacent portion spaced from said region of opposite conductivity type by a second charge transfer region,
    a charge drain region spaced from said second charge storage region by a third charge transfer region in said surface adjacent portion contiguous with said second storage region,
    means for storing charge in said first storage region including a first conductor insulatingly overlying said first storage region and means for biasing said first conductor with respect to said substrate to establish depletion in said storage region,
    means for controlling the transfer of charge stored in said first charge storage region through said first charge transfer region to said region opposite conductivity including a first transfer electrode insulatingly overlying said first charge transfer region and means for controllably biasing said first charge transfer electrode with respect to said substrate,
    means for controlling the transfer of charge from said region of opposite conductivity type through said second charge transfer region to said second storage region including a second transfer electrode insulatingly overlying said second charge transfer region and means for controllably biasing said second charge transfer electrode with respect to said substrate,
    means for controllably removing charge from said second charge storage region through said third charge transfer region to said charge drain region including a third transfer electrode insulatingly overlying said third charge transfer region and means for controllably biasing said third charge transfer electrode with respect to said substrate,
    means for applying a first biasing voltage to said second transfer electrode and a second biasing voltage to said third transfer electrode to establish a first reference potential on said region of opposite conductivity type and a second reference potential on said second storage region energetically favorable for the transfer of charge from said region of opposite conductivity type to said second storage region, said drain region being set at a potential energetically favorable for the removal of charge from said second storage region, the potential of said region of opposite conductivity type bearing a fixed voltage relationship to said first biasing voltage, means for isolating said second storage region by setting said second biasing voltage to establish a potential in said third charge transfer region energetically unfavorable for the transfer of charge from said second storage region, means for effecting the transfer of charge representing an information bearing signal from said first storage region to said region to said region of opposite conductivity type by applying a third biasing voltage to said first transfer electrode, means for effecting the transfer of charge representing said information bearing signal from said region of opposite conductivity type into said second storage region by maintaining said first biasing voltage on said second transfer electrode.

6. The apparatus of claim 5 in which a fourth transfer electrode is provided insulatingly overlying said first charge transfer region, spaced between said first transfer electrode and said region of opposite conductivity type, and biased to a potential to permit transfer of charge between the portion of said first charge transfer region underlying said first transfer electrode and said region of opposite conductivity type.

7. The apparatus of claim 5 including means responsive to the change in voltage on said second storage region due to charge flow thereinto to provide an output signal corresponding to the information content of said first storage region.

* * * * *